(12) United States Patent
Jeong

(10) Patent No.: US 7,985,670 B2
(45) Date of Patent: Jul. 26, 2011

(54) METHOD OF FORMING U-SHAPED FLOATING GATE WITH A POLY META-STABLE POLYSILICON LAYER

(75) Inventor: Tae-Woong Jeong, Gangnam-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 435 days.

(21) Appl. No.: 12/121,818

(22) Filed: May 16, 2008

(65) Prior Publication Data

US 2008/0290395 A1 Nov. 27, 2008

(30) Foreign Application Priority Data

May 25, 2007 (KR) .................. 10-2007-0050894

(51) Int. Cl.
 *H01L 21/3205* (2006.01)
(52) U.S. Cl. ......... 438/593; 438/588; 257/309; 257/317
(58) Field of Classification Search .................. 438/593
 See application file for complete search history.

(56) References Cited

U.S. PATENT DOCUMENTS

| | | | | |
|---|---|---|---|---|
| 6,153,472 A * | 11/2000 | Ding et al. | ..................... | 438/264 |
| 6,373,095 B1 | 4/2002 | Bracchitta et al. | | |
| 6,413,818 B1 * | 7/2002 | Huang et al. | .................. | 438/257 |
| 6,537,880 B1 * | 3/2003 | Tseng | ............................ | 438/260 |
| 6,876,032 B2 * | 4/2005 | Hsieh | ............................ | 257/315 |
| 6,989,319 B1 | 1/2006 | Ramsbey et al. | | |
| 7,094,643 B2 * | 8/2006 | Yoon | ............................... | 438/257 |
| 2002/0160559 A1 * | 10/2002 | Lee et al. | ....................... | 438/200 |
| 2002/0160571 A1 * | 10/2002 | Tseng | ............................ | 438/257 |
| 2004/0203201 A1 * | 10/2004 | Sihn et al. | ..................... | 438/239 |
| 2005/0269618 A1 * | 12/2005 | Shin et al. | ..................... | 257/309 |

FOREIGN PATENT DOCUMENTS

KR 10-2007-0000603 1/2007

* cited by examiner

*Primary Examiner* — Wael M Fahmy
*Assistant Examiner* — Abul Kalam
(74) *Attorney, Agent, or Firm* — Sherr & Vaughn, PLLC

(57) ABSTRACT

A method of realizing a flash floating poly gate using an MPS process can include forming a tunnel oxide layer on an active region of a semiconductor substrate; and then forming a first floating gate on and contacting the tunnel oxide layer; and then forming second and third floating gates on and contacting the first floating gate, wherein the second and third floating gates extend perpendicular to the first floating gate; and then forming a poly meta-stable polysilicon layer on the first, second and third floating gates; and then forming a control gate on the semiconductor substrate including the poly meta-stable polysilicon layer. Therefore, it is possible to increase the surface area of the capacitor by a limited area in comparison with a flat floating gate. As a result, it is possible to improve the coupling ratio essential to the flash memory device and to improve the yield and reliability of the semiconductor device.

13 Claims, 6 Drawing Sheets

… (1)

METHOD OF FORMING U-SHAPED FLOATING GATE WITH A POLY META-STABLE POLYSILICON LAYER

The present application claims priority under 35 U.S.C. §119 to Korean Patent Application No. 10-2007-0050894 (filed May 25, 2007), which is hereby incorporated by reference in its entirety.

BACKGROUND

Figure 1:
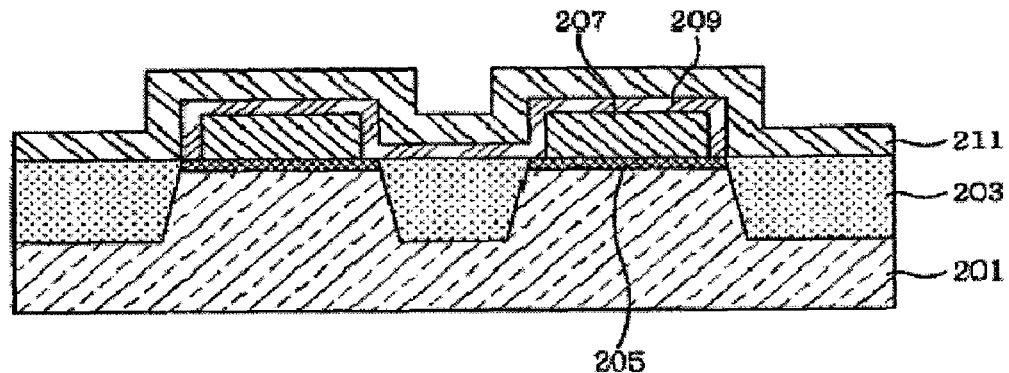

As illustrated in example FIG. 1, a flash floating poly gate structure may be manufactured using schemes illustrated in example FIGS. 2A to 2D.

Figure 2A:
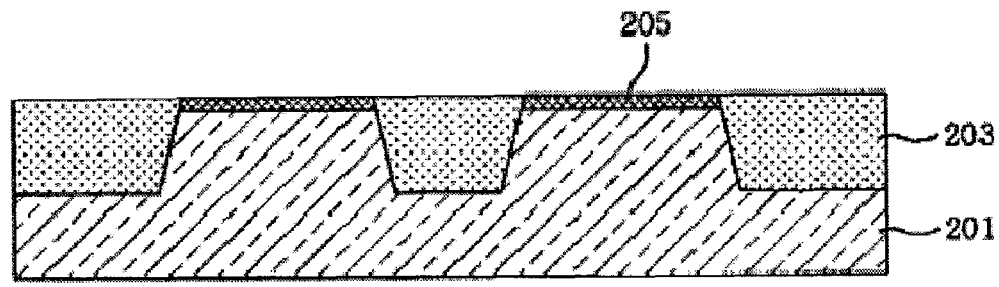

As illustrated in example FIG. 2A, a semiconductor process may be performed to form the active region of semiconductor substrate 201 (for example, a silicon substrate, a ceramic substrate, and a polymer substrate) and shallow trench isolation (STI) 203 for device isolation and to form tunnel oxide 205 in the active region on and/or over substrate 210.

Figure 2B:
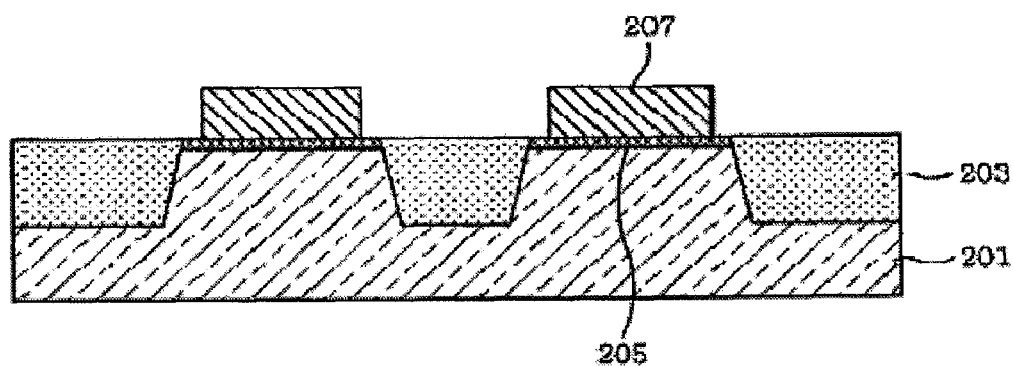

As illustrated in example FIG. 2B, poly floating gate 207 may be formed on and/or over tunnel oxide 205.

Figure 2C:
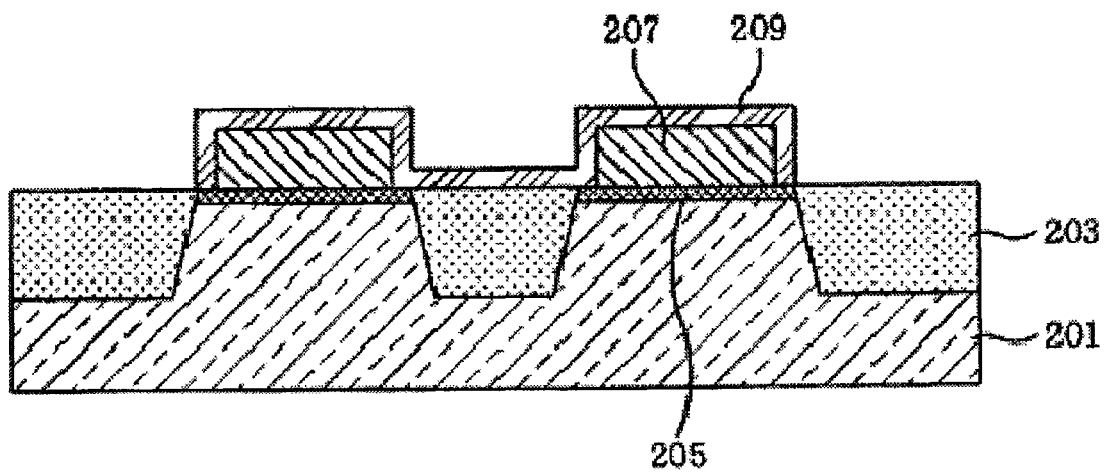

As illustrated in example FIG. 2C, dielectric layer composed as oxide-nitride-oxide (ONO) layer 209 may be deposited on and/or over flowing gate 207.

Figure 2D:
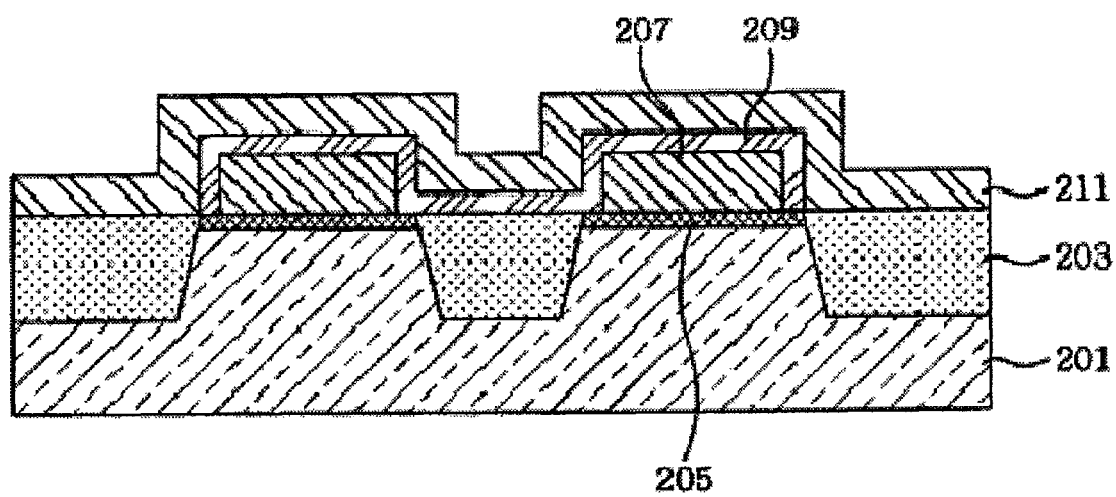

As illustrated in example FIG. 2D, control gate 211 may then be deposited on and/or over the entire surface of semiconductor substrate 201 including ONO layer 209 to realize a flash floating poly gate.

However, in manufacturing the flash floating poly gate as illustrated in example FIGS. 1 and 2A to 2D, high integration may be obtained so that an area occupied by a capacitor in a flash memory device may be reduced, that the surface area of the capacitor may be reduced, and that a coupling ratio essential to the flash memory device may be significantly reduced to deteriorate the yield and reliability of the semiconductor device.

SUMMARY

Embodiments relate to a semiconductor device and a method of manufacturing the same, and more particularly, to a semiconductor device that can realize a flash floating poly gate and a method of manufacturing the same.

Embodiments relate to a semiconductor device that can realize a flash floating poly gate using a meta-stable polysilicon (MPS) process to increase the overall surface area of a capacitor and to improve a coupling ratio essential to a flash memory device and a method of manufacturing the same.

Embodiments relate to a semiconductor device that can include at least one of the following: a crown-shaped floating gate formed on and/or over a semiconductor substrate; a poly particle-shaped MPS formed on and/or over the floating gate; a dielectric layer formed in the MPS; and a control gate formed on and/or over an entire surface of the semiconductor substrate including the dielectric layer.

Embodiments relate to a method of manufacturing a semiconductor device that can include at least one of the following steps: forming a tunnel oxide layer in an active region of a semiconductor substrate; and then forming a poly floating gate on and/or over the tunnel oxide layer; forming PR on and/or over an entire surface of the semiconductor substrate and selectively patterning the formed PR to form a PR pattern; and then forming a side floating gate on and/or over the formed PR pattern and the partially exposed floating gate and removing the PR pattern and the side floating gate formed only on and/or over the PR pattern to form a crown-shaped floating gate; and then forming poly MPS on and/or over the crown-shaped floating gate and the partially exposed floating gate; and then forming a dielectric material on and/or over the poly MPS and forming a control gate on and/or over the entire surface of the semiconductor substrate having the dielectric material.

DRAWINGS

Example FIGS. 1 to 2 illustrate a flash floating poly gate structure of a semiconductor device and a method of manufacturing the same.

Figure 3:
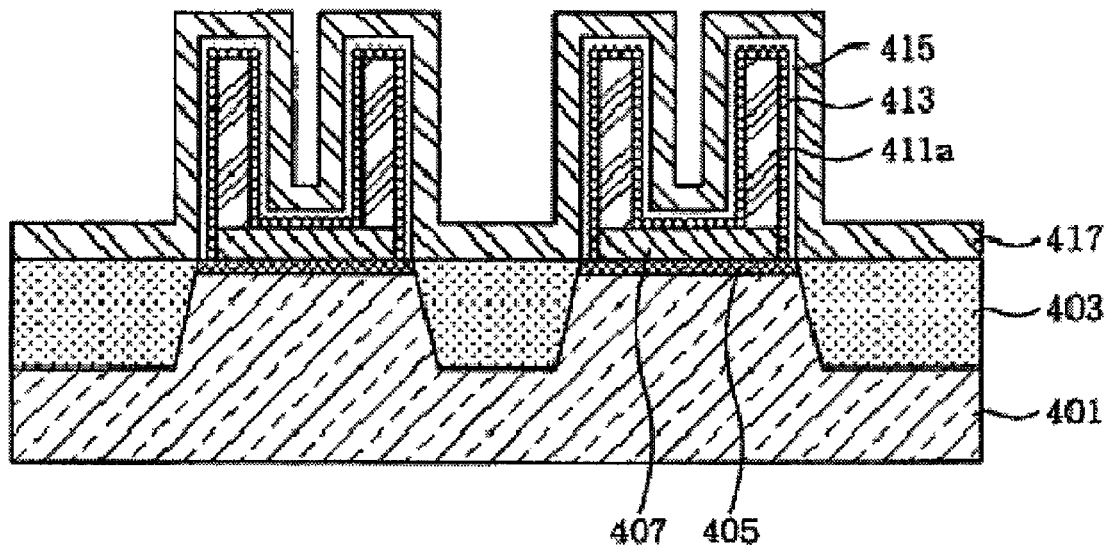

Example FIGS. 3 to 4 illustrate a flash floating poly gate structure of a semiconductor device and a method of manufacturing the same, in accordance with embodiments.

DESCRIPTION

As illustrated in example FIG. 3, floating gate 411a having a crown-shape (U-shape) and a partially exposed floating gate 407 can be formed on and/or over semiconductor substrate 401 including tunnel oxide layer 405. Substrate 401 can have shallow trench isolations (STI) 403 for device isolation. The U-shaped floating gate can be formed by removing photoresist (PR) by a PR ashing process in a lift-off method. Then, poly particle-shaped MPS 413 can then be formed on and/or over U-shaped floating gate 411a and partially exposed floating gate 407. Poly particle-shaped MPS 413 can be formed by performing an MPS annealing process in an $N_2$ atmosphere at a reaction temperature between 800° C. and 1,500° C. A dielectric layer can be composed as oxide-nitride-oxide (ONO) layer 415 can then be formed on and/or over poly particle-shaped MPS 413. Control gate 417 can then be deposited on and/or over the entire surface of semiconductor substrate 401 including ONO layer 415 to realize a flash floating poly gate structure. Therefore, in accordance with embodiments, after forming the U-shaped floating gate poly, the flash floating poly gate can be realized on and/or over the floating gate poly using a poly particle-shaped MPS process so that a coupling ratio essential to a flash memory device can be improved.

Figure 4A:
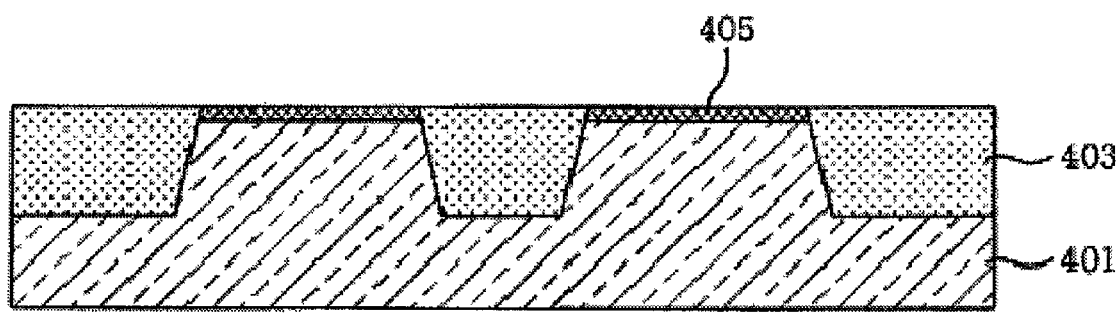

As illustrated in example FIG. 4A, a method of manufacturing the flash floating poly gate of a semiconductor device as illustrated in example FIG. 3 can include forming the active region of semiconductor substrate 401 such as a silicon substrate, a ceramic substrate, and a polymer substrate. STI layers 403 for device isolation can be formed in substrate 401 and tunnel oxide layer 405 can then be formed in the active region of substrate 401.

Figure 4B:
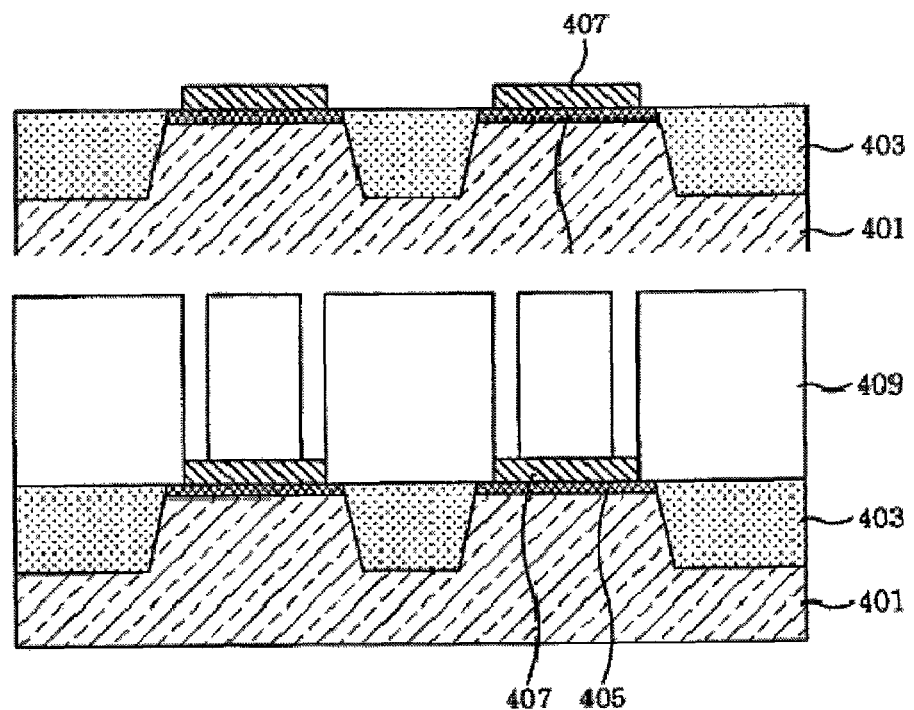

As illustrated in example FIG. 4B, poly floating gate 407 can then be formed on and/or over and contacting tunnel oxide layer 405.

As illustrated in example FIG. 4C, photoresist (PR) can then be formed on and/or over the entire surface of semiconductor substrate 401 at a thickness of between 1,000 Å and 2,000 Å. Exposure and development processes can then be performed to selectively pattern the applied PR and thereby form PR patterns 409 on and/or over STI 403, tunnel oxide layer 405 and poly floating gate 407. Poly floating gate 407 can be partially exposed as a result.

Figure 4D:
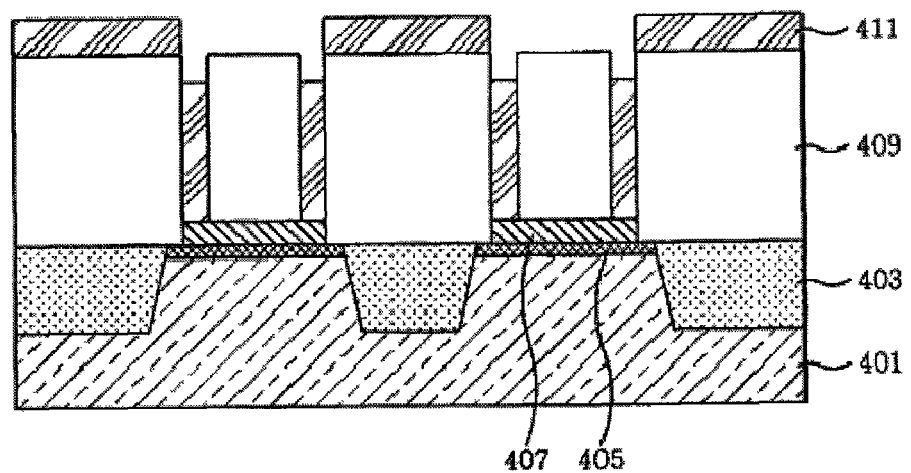

As illustrated in example FIG. 4D, side floating gates 411 can then be deposited on and/or over PR pattern 409 and the partially exposed floating gate 407.

Figure 4E:
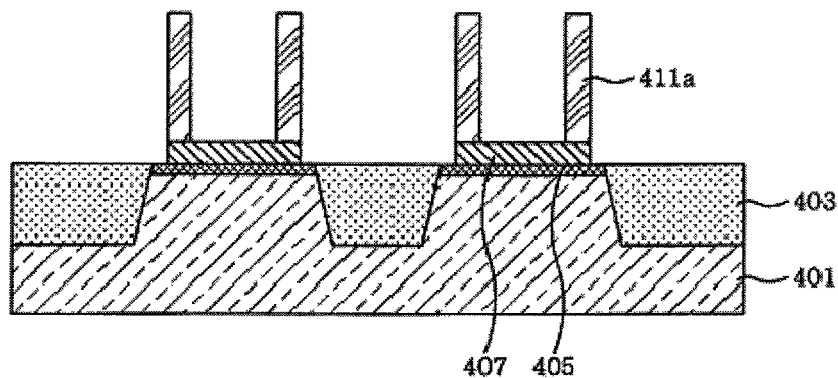

As illustrated in example FIG. 4E, when a PR ashing process can then be performed by a lift-off method to remove PR patterns 409 and side floating gate 411 deposited on and/or over PR pattern 409, thereby forming vertically extending floating gates 411a which combine with horizontally extending poly floating gate 407 to form a U-shaped floating gate.

Figure 4F:
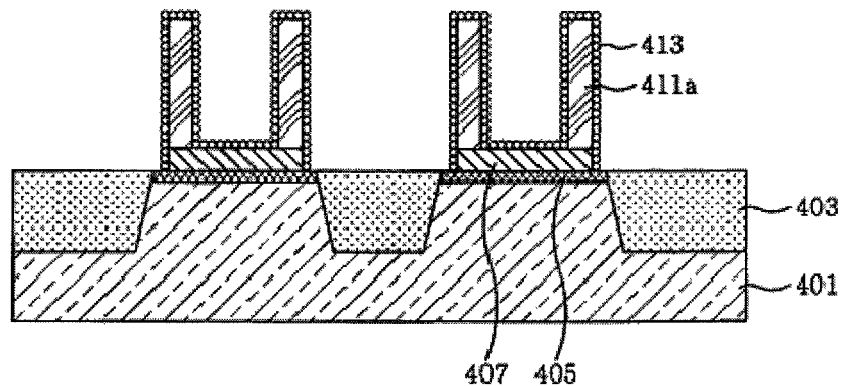

As illustrated in example FIG. 4F, an MPS annealing process can then be performed on the crown-shaped floating gate including floating gates 411a and the partially exposed floating gate 407 in a N2 atmosphere at a reaction temperature between 800° C. and 1,500° C. to form poly particle-shaped MPS 413.

Figure 4G:
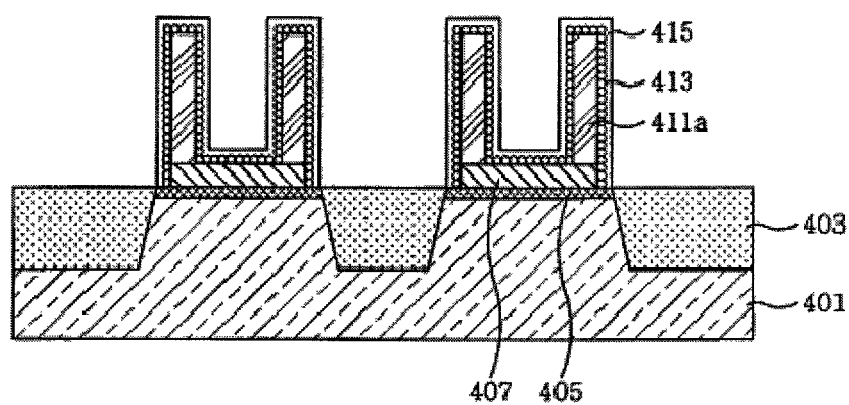

As illustrated in example FIG. 4G, ONO layer 415 that is formed as a dielectric layer can then be deposited on and/or over poly particle-shaped MPS 413.

Figure 4H:
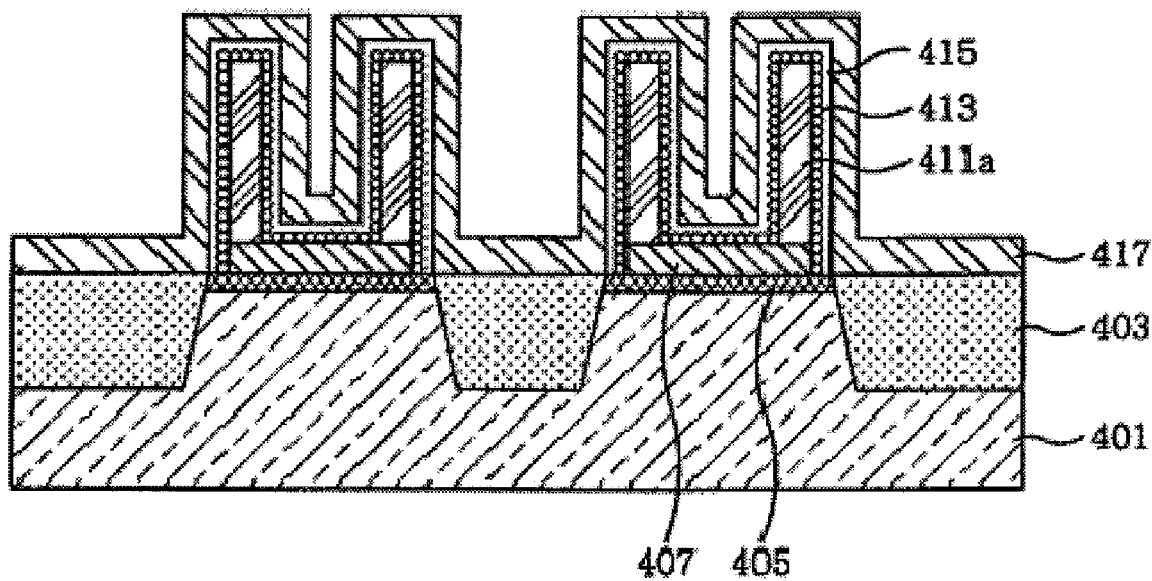

As illustrated in example FIG. 4H, control gate 417 can then be deposited on and/or over the entire surface of semiconductor substrate 401 including ONO layer 415 to realize a flash floating poly gate.

The poly particle-shaped MPS process in accordance with embodiments can be used to realize a flash floating gate which can prevent: a reduction in area occupied by the capacitor in the flash memory device, a reduction in surface area of the capacitor, and significant deterioration of the coupling ratio essential to the flash memory device. Therefore, it is possible to improve the yield and reliability of the semiconductor device. In addition, high integration can be achieved so that it is possible to: improve the yield and reliability of the semiconductor, reduce manufacturing cost, and maximize the performance of the semiconductor device.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of manufacturing a semiconductor device comprising:
   forming a tunnel oxide layer in an active region of a semiconductor substrate;
   forming a poly floating gate on the tunnel oxide layer;
   forming a photoresist layer on an entire surface of the semiconductor substrate;
   selectively patterning the photoresist layer to form photoresist patterns partially exposing the poly floating gate;
   forming side floating gates on the photoresist patterns and the partially exposed floating gate;
   forming a U-shaped floating gate by removing the photoresist patterns and the side floating gates formed only on the photoresist patterns;
   forming a poly meta-stable polysilicon layer on the U-shaped floating gate; and
   forming a control gate on the entire surface of the semiconductor substrate including the meta-stable poly silicon layer.

2. The method of claim 1, wherein the poly meta-stable polysilicon layer is particle-shaped.

3. The method of claim 2, wherein the poly meta-stable poly silicon layer is formed by performing a meta-stable polysilicon annealing process at a predetermined temperature in an $N_2$ atmosphere.

4. The method of claim 3, wherein the predetermined temperature is between 800° C. and 1,500° C.

5. The method of claim 1, wherein the U-shaped floating gate is formed by a photoresist ashing process using a lift-off method.

6. The method of claim 1, wherein, the photoresist is formed to a thickness between 1,000 Å and 2,000 Å.

7. The method of claim 1, further comprising, after forming the poly meta-stable polysilicon layer and before forming the control gate:
   forming a dielectric layer over the poly meta-stable poly silicon layer.

8. A method of manufacturing a semiconductor device comprising:
   forming a tunnel oxide layer on an active region of a semiconductor substrate;
   forming a first floating gate on and contacting the tunnel oxide layer;
   forming second and third floating gates on and contacting the first floating gate, wherein the second and third floating gates extend perpendicular to the first floating gate;
   forming a poly meta-stable polysilicon layer on the first, second and third floating gates; and
   forming a control gate on the semiconductor substrate including the poly meta-stable polysilicon layer,
   wherein the forming the second and third floating gates comprises:
   forming a photoresist layer on the semiconductor substrate including the first floating gate;
   forming photoresist patterns partially exposing the first floating gate by selectively patterning the photoresist layer;
   forming side floating gates on the photoresist patterns and the partially exposed first floating gate;
   removing the photoresist patterns and the side floating gates formed only on the photoresist patterns.

9. The method of claim 8, wherein the photoresist layer is formed at a thickness of between 1,000 Å and 2,000 Å.

10. The method of claim 8, wherein forming the poly meta-stable polysilicon layer comprises:
    performing a meta-stable polysilicon annealing process on the first, second and third floating gates in a N2 atmosphere at a predetermined temperature.

11. The method of claim 10, wherein the predetermined temperature is between 800° C. and 1,500° C.

12. The method of claim 8, further comprising, after forming the poly meta-stable polysilicon layer and before forming the control gate:
    forming a dielectric layer over the poly meta-stable polysilicon layer.

13. The method of claim 12, wherein the dielectric layer comprises an ONO layer.

* * * * *